United States Patent [19]

Webster

[11] Patent Number: 5,420,524
[45] Date of Patent: May 30, 1995

[54] DIFFERENTIAL GAIN STAGE FOR USE IN A STANDARD BIPOLAR ECL PROCESS

[75] Inventor: Stephen Webster, Oakville, Canada

[73] Assignee: Gennum Corporation, Burlington, Canada

[21] Appl. No.: 157,242

[22] Filed: Nov. 26, 1993

[51] Int. Cl.⁶ .................. H03K 19/003; H03K 19/086
[52] U.S. Cl. .................................. 326/21; 326/127; 326/15
[58] Field of Search ............... 307/443, 455, 246, 446; 326/21, 22, 126, 127, 15; 327/382

[56] References Cited

U.S. PATENT DOCUMENTS 5,289,055 2/1994 Razavi ................................ 307/455
5,298,802 3/1994 Usami et al. ...................... 307/446

Primary Examiner—Edward P. Westin
Assistant Examiner—Jon Santamauro
Attorney, Agent, or Firm—Bereskin & Parr

[57] ABSTRACT

An improved differential gain stage for a bipolar monolithic integrated circuit. The integrated circuit is formed from a semiconductor substrate, and the differential gain stage includes first and second bipolar transistors. The base of the first transistor and the base of the second transistor form a differential input for the gain stage comprising non-inverting and inverting inputs respectively. The collectors of the transistors form a differential output. The differential gain stage includes a capacitor stage comprising: a peaking capacitor, and first, second, third and fourth capacitor structures. The peaking capacitor is coupled between the emitters of the first and second transistors. The first and second capacitor structures are located at a first spaced relationship from the substrate and the first capacitor is coupled to the emitter of the first transistor and the second capacitor is coupled to the emitter of the second transistor. The third and fourth capacitor structures are located at a second spaced relationship from the substrate. The third capacitor is connected to the first capacitor and the connection forms a first node. The fourth capacitor is connected to the second capacitor and the connection forms a second node. The differential gain stage also includes first and second buffers. The first buffer has an input connected to the non-inverting input of the gain stage and an output connected to the first node. The second buffer has an input connected to the inverting input of the gain stage and an output connected to the second node.

8 Claims, 4 Drawing Sheets

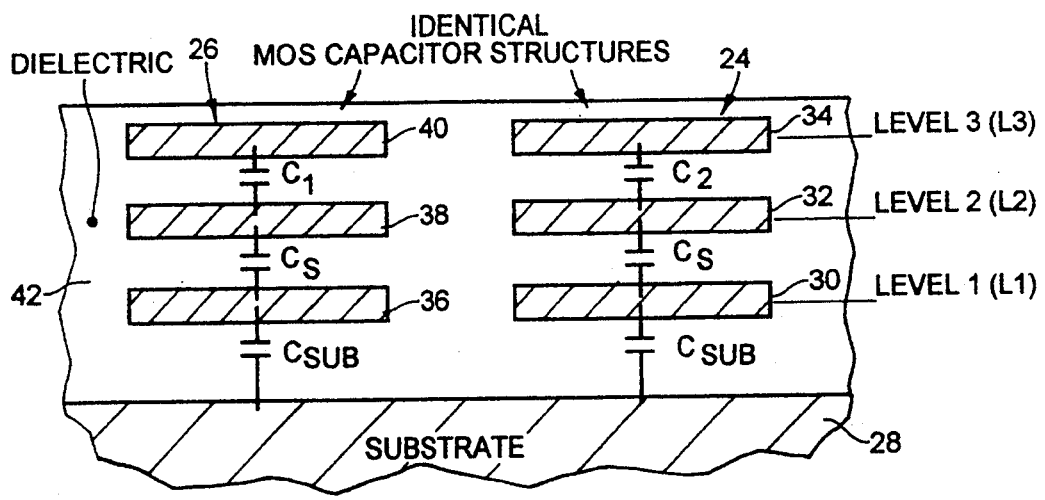
FIG. 2
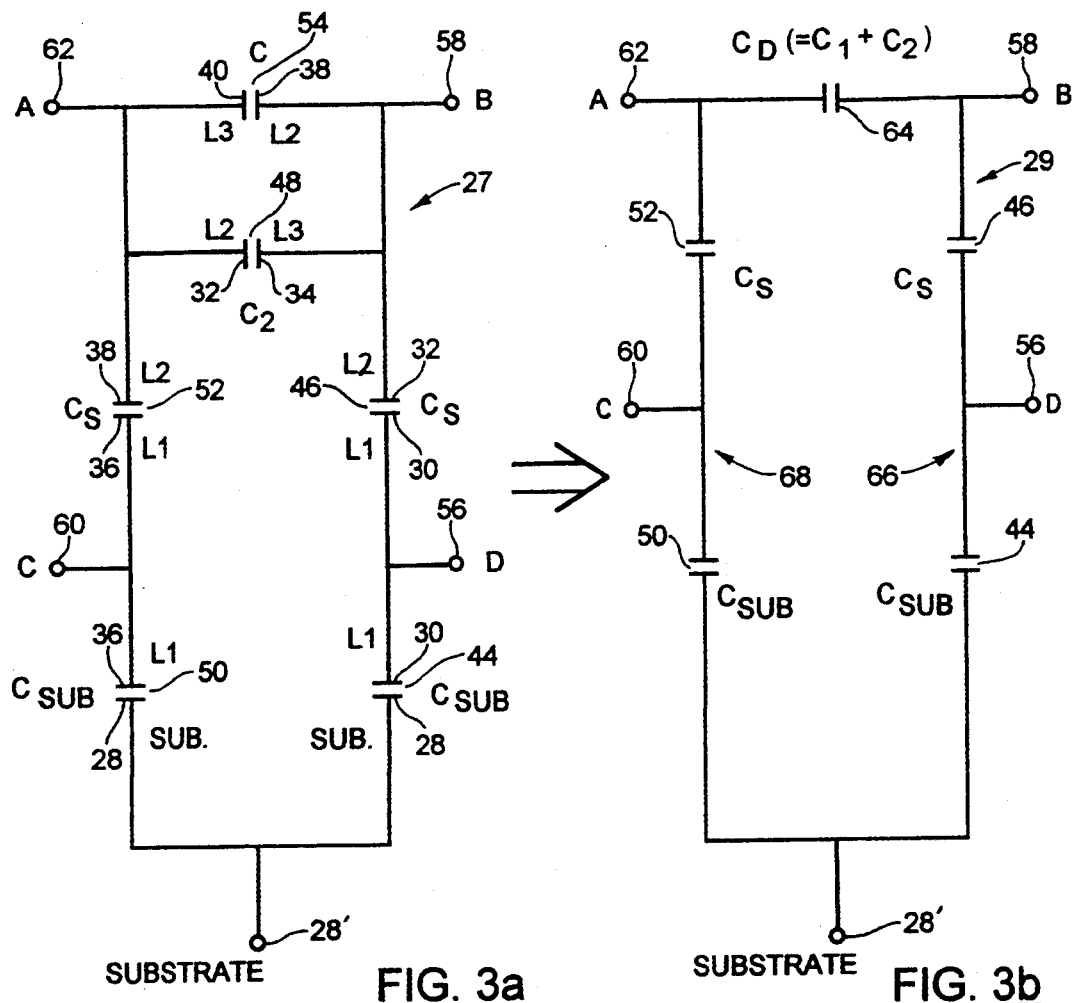
FIG. 3a
FIG. 3b

DIFFERENTIAL GAIN STAGE FOR USE IN A STANDARD BIPOLAR ECL PROCESS

FIELD OF THE INVENTION

The present invention relates to integrated circuits. More particularly, the present invention relates to an integrated circuit topology for implementing a differential gain stage in an integrated circuit using a standard bipolar ECL process which has no dedicated MOS capacitor oxide step.

BACKGROUND OF THE INVENTION

Differential amplifiers according to the prior art have a peaking frequency response which is dependent on a capacitor. For the amplifier to have a good common mode rejection ratio (CMRR), the impedances of the emitter current sources should remain high for all frequencies of operation for the amplifier. While it is generally not a problem to achieve this with modern high-speed bipolar processes, the presence of the capacitor does pose some difficulties with respect to the physical implementation of the circuit in a monolithic integrated circuit form.

The difficulty arises from the inherent inability to fabricate a true floating capacitor structure using a standard bipolar integrated circuit fabrication process. All known practical implementations result in some additional and unwanted parasitic capacitance between the capacitor structure and the external nodes, e.g. usually the substrate node of the integrated circuit. This unwanted parasitic capacitance appears as a shunt with the emitter current sources thereby causing a reduction in impedance, and a consequent reduction in the common mode rejection ratio of the amplifier when operating at high frequencies.

While small signal analysis of the amplifier may suggest that a high common mode rejection ratio can be maintained provided there is symmetry in the capacitor structure (i.e. leading to a cancellation of the unwanted common mode terms in the differential output), the non-linearities in the large-signal transfer function of the amplifier stage lead to an undesirable mixing of the common-mode and differential-mode signals. Under these conditions, the effective common mode rejection ratio can drop to an unacceptably low figure. Therefore, the physical implementation of a differential gain stage in a monolithic integrated circuit remains a problem.

BRIEF SUMMARY OF THE INVENTION

The present invention provides a "bootstrapping" circuit which is applied in conjunction with a three-plate MOS capacitor structure to produce a topology which can substantially reduce the undesirable effects of the parasitic capacitance of the capacitor on the performance of the amplifier.

The circuit technique, according to the present invention, is suitable for integrated circuit processes which support the construction of MOS capacitors using a minimum of three oxide isolated conductive layers, and is effective for use with processes having no dedicated thin oxide step.

In a first aspect, the present invention provides an improved differential gain stage for use in a bipolar monolithic integrated circuit comprising a substrate formed from a semiconductor, the differential gain stage including a first transistor having input, output and control terminals, and a second transistor having input, output and control terminals, the control terminal of the first transistor being coupled to the control terminal of the second transistor, the input terminal of the first transistor forming a non-inverting input for the gain stage and the output terminal providing an inverting output for the gain stage, and the input terminal of the second transistor forming an inverting input for the gain stage and the output terminal providing a non-inverting output for the gain stage, the differential gain stage including a capacitor stage comprising: (a) a peaking capacitor having first and second terminals and being coupled between said control terminals of the first and second transistors; (b) first and second capacitor means located at a first spaced relationship from the substrate and said first capacitor means being coupled to the control terminal of the first transistor and said second capacitor means being coupled to the control terminal of the second transistor; (c) third and fourth capacitor means located at a second spaced relationship from the substrate and said third capacitor means being connected to said first capacitor means and said connection forming a first node and said fourth capacitor means being connected to said second capacitor means and said connection forming a second node; (d) first buffer means having an input connected to the non-inverting input of the gain stage and an output connected to said first node; and (e) second buffer means having an input connected to the inverting input of the gain stage and an output connected to said second node.

BRIEF DESCRIPTION OF THE DRAWINGS

For a better understanding of the present invention, and to show more clearly how it may be carried into effect, reference will now be made, by way of example, to the accompanying drawings which show preferred embodiments of the present invention, and in which:

FIG. 2 is a cross-sectional view of a capacitor structure according to the present invention;

FIGS. 3(a) and 3(b) are schematic diagrams each depicting an equivalent circuit for the capacitor structure of FIG. 2;

DETAILED DESCRIPTION OF THE PREFERRED EMBODIMENTS

Figure 1:
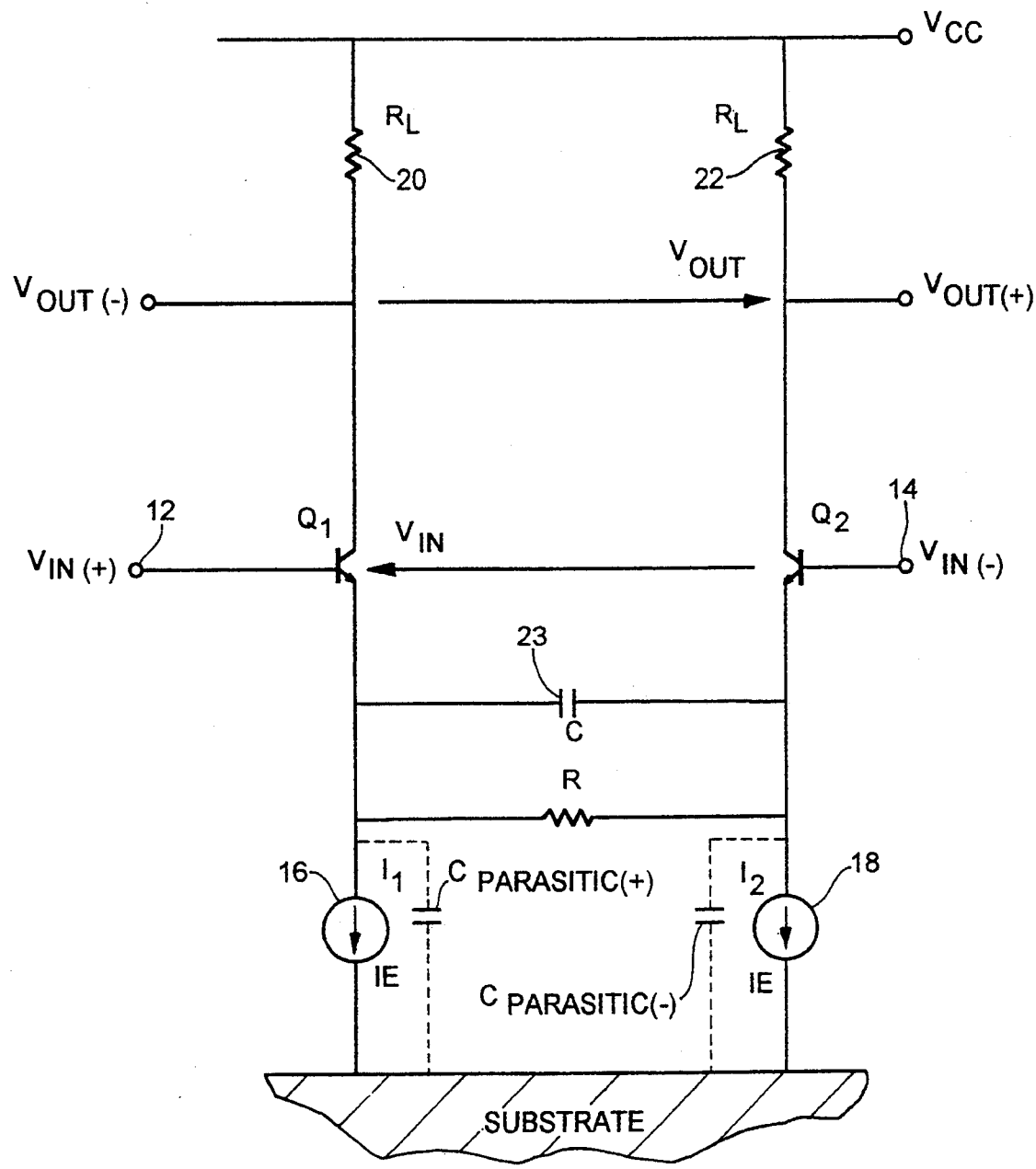
FIG. 1 shows a known differential amplifier stage having a peaking frequency response.

Reference is first made to FIG. 1 which shows a differential amplifier 10 according to the prior art. In known manner, the differential amplifier 10 has two inputs 12,14 and produces an output signal $V_{out}$ which is a function of the difference between the inputs 12,14.

As shown in FIG. 1, the differential amplifier 10 comprises a pair of transistors $Q_1, Q_2$ which are coupled at their respective emitters. Each of the emitters is biased by a respective emitter current source 16,18 which each sink a current $I_e$. The base of the first transistor $Q_1$ provides the first input 12 for input signal $V_{in(+)}$ and the base of the second transistor $Q_2$ provides the other input 14 for input signal $V_{in(-)}$. The output signal $V_{out}$ is taken between the collectors of the transistors $Q_1, Q_2$ which are each connected to a positive supply rail $V_{cc}$ through respective load resisters 20,22. The output signal $V_{out}$ represents the difference between the collector output $V_{out(+)}$ of transistor $Q_2$ and the collector output $V_{out(-)}$ of transistor $Q_1$. An ideal differential amplifier produces an output signal (i.e. $V_{out}$) which is zero when the input signals are equal (i.e. $V_{in(+)} = V_{in(-)}$). In a practical differential amplifier 10, there will be a small positive signal $V_{out(+)}$ or a small negative output $V_{out(-)}$. The common mode rejection ratio (CMRR) of the differential amplifier 10 provides a measure of the ability of the amplifier 10 to produce a zero output signal $V_{out}$ when the input signals $V_{in(+)}, V_{in(-)}$ are equal.

The differential amplifier 10 has a peaking frequency response which is determined by a capacitor denoted by reference 23. For the amplifier 10 to have a good common mode rejection ratio (or CMRR), the impedance of the emitter current sources 16,18 must remain high for all frequencies of operation of the amplifier 10.

Reference is next made to FIG. 2 which illustrates two symmetrical three-plate MOS (Metal Oxide Semiconductor) capacitor structures according to the present invention which are denoted by references 24,26 respectively. The MOS capacitor structure 24 according to the present invention is suitable for use with a differential amplifier 10 (FIG. 1) which is manufactured as a monolithic integrated circuit. In a monolithic integrated circuit, all the circuit components, e.g. transistors $Q_1, Q_2$ are fabricated, in known manner, into or on top of a semiconductor substrate, indicated by reference 28 in FIG. 2. The first MOS capacitor structure 24 comprises a first capacitor plate or layer 30, a second capacitor plate 32 or $C_S$, and a third capacitor plate 34 or $C_2$. The first capacitor plate 30 forms a capacitance $C_{sub}$ with the substrate 28. The second capacitor plate 32 and first capacitor plate 30 form a capacitance $C_S$, and the second and third capacitor plates 32,34 form a capacitance $C_2$. Similarly, the second MOS capacitor structure 26 comprises a fourth capacitor plate or layer 36, a fifth capacitor plate 38, and a sixth capacitor plate 40, which are located at the same level as the first, second and third capacitor plates 30,32,34. Furthermore, the fourth capacitor plate 36 and substrate 28 form a capacitance $C_{sub}$. The fourth and fifth capacitor plates 36,38 form a capacitance $C_S$, and the fifth and sixth capacitor plates 38,40 form a capacitance $C_1$. Each of the capacitor plates 30,32,34,36,38,40 is separated by a suitable dielectric 42 as shown in FIG. 2.

Referring next to FIG. 3(a), the two MOS capacitor structures 24, 26 (FIG. 2) are connected in a cross-coupled fashion and shown as an equivalent circuit which is denoted by reference 27. The first capacitor plate 30 and the substrate 28 are shown as a first capacitor 44 having a capacitance $C_{sub}$. The first and second capacitor plates 30,32 are shown as a second capacitor 46 having a capacitance $C_S$. The second and third capacitor plates 32,24 are shown as a third capacitor 48 which has a capacitance $C_2$. Similarly, the fourth capacitor plate 36 and the substrate form a fourth capacitor 50 having the capacitance $C_{sub}$. The fourth and fifth capacitor plates 36,38 form a fifth capacitor 52 having a capacitance $C_S$, and the fifth and sixth capacitor plates 38,40 form a sixth capacitor 54 having a capacitance $C_1$.

Referring still to FIG. 3(a), there is a first terminal or node 56 at the connection between the first and second capacitors 44,46, and there is a second node 58 at the connection between the second and third capacitors 46,48. Similarly, there is a third node 60 at the connection between the fourth and fifth capacitors 50,52, and a fourth node 62 at the connection of the fifth and sixth capacitors 52,54.

Reference is next made to FIG. 3(b) which shows an equivalent circuit 29 that is identical to the circuit 27 shown in FIG. 3(a) except the third and sixth capacitors 48,54 have been combined as a capacitor 64. The combined capacitor 64 has a capacitance which is denoted by reference $C_D$. The capacitance $C_D$ comprises the capacitances $C_1$ and $C_2$ which are in parallel. The capacitor 64 corresponds to the capacitor 24 which is coupled between the emitters of the differential amplifier 10 (see FIG. 1 above). As shown in FIG. 3(b), the capacitance $C_D$ is available between the second and fourth terminals 58,62 of the equivalent circuit.

Referring still to FIG. 3(b), the capacitances $C_{sub}$ and $C_S$ represent parasitic capacitances which arise in a monolithic integrated circuit. The parasitic capacitance associated with the capacitance $C_D$ is made up of two identical branches 66,68. The first branch 66 comprises the first and second capacitors 46,44 in series and having capacitances $C_S$ and $C_{SUB}$ respectively. The second branch 68 comprises the fourth and fifth capacitors 52,50 in series and also having capacitances $C_S$ and $C_{SUB}$. As described above, the MOS capacitor structures 24,26 are identical. As shown in FIG. 3(b), the first branch 66 couples the terminal 58 to the substrate 28, and the second branch 68 couples the other terminal 62 to the substrate 28. In FIG. 3(b), the substrate is represented as a common node denoted by reference 28'.

Referring still to FIGS. 3(a) and 3(b), the first and third nodes or terminals 56,60 are located at the midpoint of the series connected capacitors 44,46 and the capacitors 50,52 respectively. In other words, the first and third terminals 56,60 physically correspond to the first layer capacitor plates 30,36 of the structures 24,26 shown in FIG. 2. This results in the first layer capacitor plates 30,36 providing an electrostatic screen between the second layer capacitor plates 32,38 and the third layer plates 34,40 and the substrate 28. Furthermore, the capacitance associated with the electrostatic screen is the capacitance $C_S$.

As will now be described with reference to FIGS. 4 and 5, the MOS structures 24,26 can be used with the differential amplifier 10 (FIG. 1) in order to reduce or eliminate the unwanted effects of parasitic capacitance in the monolithic integrated differential amplifier 10. There are two methods for using the dual MOS capacitor structures 24,26 with a differential amplifier 10 in order to reduce or eliminate the unwanted effects of the parasitic capacitances $C_{Parasitic(1)}$ and $C_{Parasitic(2)}$ (FIG. 1). These parasitic capacitances are represented by the capacitances $C_S$ and $C_{SUB}$ in the equivalent circuits 27,29 (FIGS. 3(a) and 3(b)).

Figure 4:
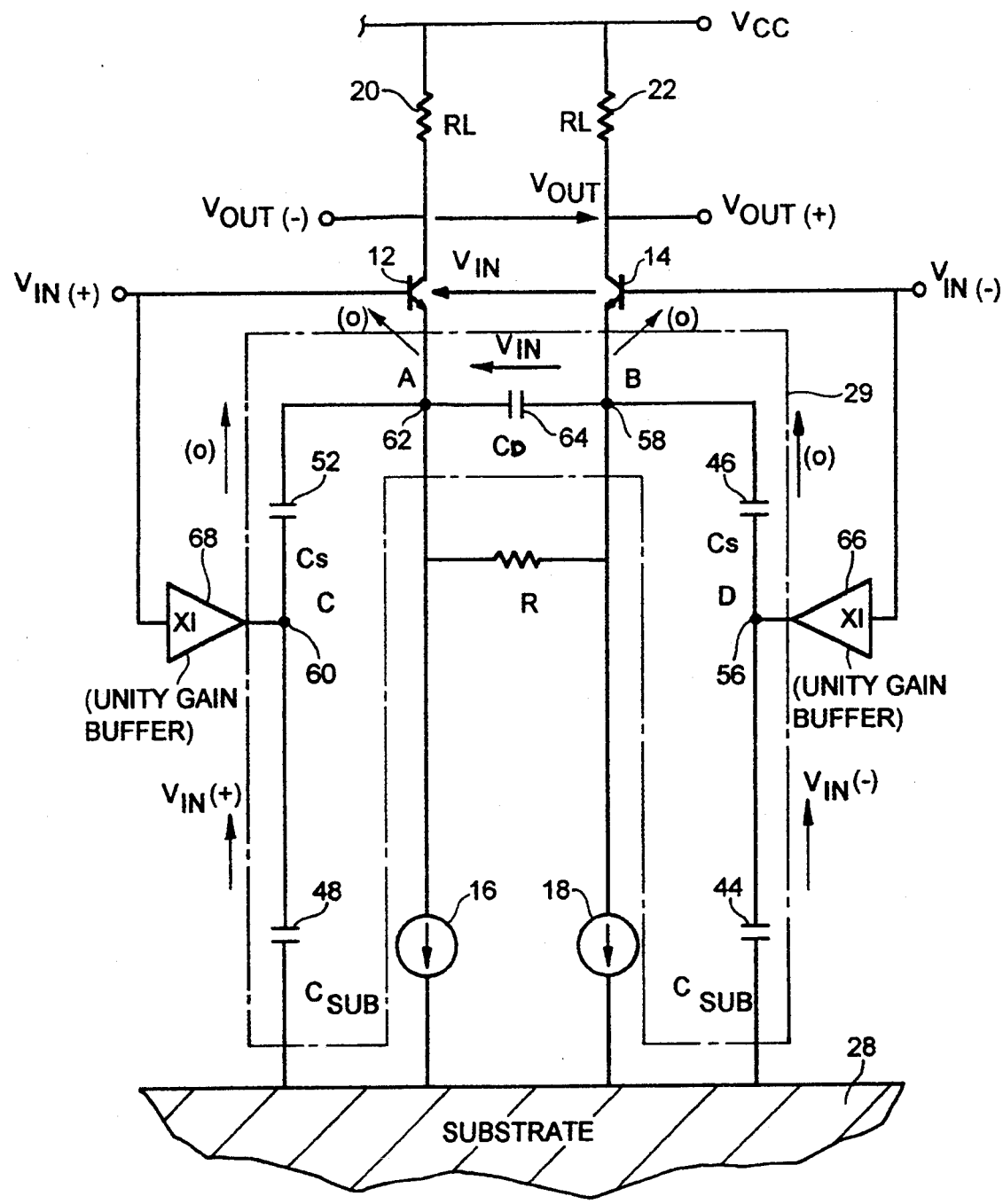
FIG. 4 is a circuit diagram which shows a differential amplifier stage incorporating the capacitor structure of FIG. 3(b)

Reference is next made to FIG. 4 in which the emitter capacitor 24 has been replaced by the equivalent circuit 29 for the dual MOS capacitor structures 24,26. The configuration shown in FIG. 4 will be referred to as a "neutralizing bootstrap" because it operates to neutralize the reactance of the capacitance $C_S$ by forcing the input signal voltage $V_{in}$ across the capacitor $C_S$ to be zero.

As shown in FIG. 4, the input signals $V_{in(+)}$ and $V_{in(-)}$ are buffered by two unity gain buffer stages 66,68 and then fed to the first and third nodes 56,60 respectively. This results in forcing the signal voltage $V_{in}$ across the capacitors 46,52 (i.e. capacitance $C_S$) to be zero. It will be understood that the signal voltages across the capacitors 44,48 (i.e. capacitance $C_{SUB}$) are the full input voltages to the amplifier 10. Therefore, the signal currents required to sustain these voltages are supplied from the buffers 66,68 and not from the amplifier 10. Thus, for the amplifier 10, the effect of the parasitic capacitances $C_{SUB}$, $C_S$ are eliminated.

Figure 5:
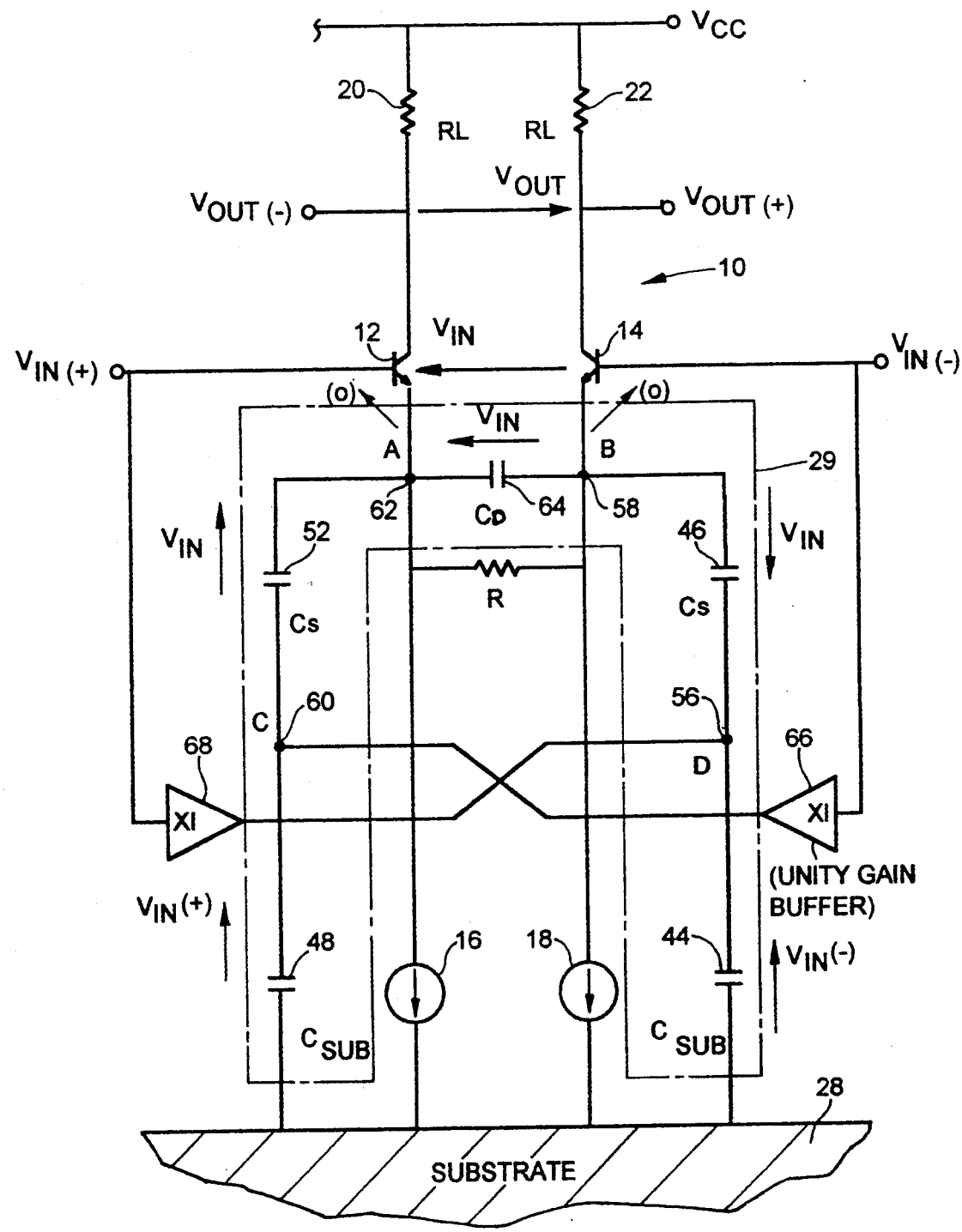
FIG. 5 is a circuit diagram showing another embodiment of the capacitor structure according to the present invention.

Reference is next made to FIG. 5 which illustrates the second technique according to the present invention. The second technique will be referred to as the "non-neutralizing bootstrap" method because instead of neutralizing the parasitic capacitance $C_S$, the second technique utilizes it as part of the response peaking capacitor 24. It will be appreciated by those skilled in the art that this results in a more efficient use of the integrated circuit area. The non-neutralizing bootstrap implementation is similar to that described with reference to FIG. 4, except the outputs of the buffers 66,68 are crossed over so that each capacitor 46,52 (i.e. capacitance $C_S$) has the differential input voltage $V_{in}$ developed across it as does the capacitance $C_D$. As viewed at the terminals 62,58, the total effective capacitance is given by the expression $C_D + C_S$, and not $C_D$ (as was the case for the first implementation). Once again, amplifier 10 is relieved of the effects of the capacitance $C_{SUB}$ by virtue of the low output impedance of the unity gain buffers 66,68.

The present invention may be embodied in other specific forms without departing from the spirit or essential characteristics thereof. Therefore, the presently disclosed embodiments are considered to be illustrative and not restrictive, the scope of the invention being indicated by the appended claims rather than the foregoing description, and all changes which come within the meaning and range of equivalency of the claims are therefore intended to be embraced therein.

I claim:

1. An improved differential gain stage for use in a bipolar monolithic integrated circuit comprising a substrate formed from a semiconductor, the differential gain stage including a first transistor having input, output and control terminals, and a second transistor having input, output and control terminals, the control terminal of the first transistor being coupled to the control terminal of the second transistor, the input terminal of the first transistor forming a non-inverting input for the gain stage and the output terminal providing an inverting output for the gain stage, and the input terminal of the second transistor forming an inverting input for the gain stage and the output terminal providing a non-inverting output for the gain stage, the differential gain stage including a capacitor stage comprising:
   (a) a peaking capacitor having first and second terminals and being coupled between said control terminals of the first and second transistors;
   (b) first and second capacitor means located at a first spaced relationship from the substrate and said first capacitor means being coupled to the control terminal of the first transistor and said second capacitor means being coupled to the control terminal of the second transistor;
   (c) third and fourth capacitor means located at a second spaced relationship from the substrate and said third capacitor means being connected to said first capacitor means and said connection forming a first node and said fourth capacitor means being connected to said second capacitor means and said connection forming a second node;
   (d) first buffer means having an input connected to the non-inverting input of the gain stage and an output connected to said first node; and
   (e) second buffer means having an input connected to the inverting input of the gain stage and an output connected to said second node.

2. An improved differential gain stage for use in a bipolar monolithic integrated circuit comprising a substrate formed from a semiconductor, the differential, gain stage including a first transistor having input, output and control terminals, and a second transistor having input, output and control terminals, the control terminal of the first transistor being coupled to the control terminal of the second transistor, the input terminal of the first transistor forming a non-inverting input for the gain stage and the output terminal providing an inverting output for the gain stage, and, the input terminal of the second transistor forming an inverting input for the gain stage and the output; terminal providing a non-inverting output for the gain stage, the differential gain stage including a capacitor stage comprising:
   (a) a peaking capacitor having first and second terminals and being coupled between said control terminals of the first and second transistors;
   (b) first and second capacitor means located at a first spaced relationship from the substrate and said first capacitor means being coupled to the control terminal of the first transistor and said second capacitor means being coupled to the control terminal of the second transistor:
   (c) third and fourth capacitor means located at a second spaced relationship from the substrate and said third capacitor means being connected to said first capacitor means and said connection forming a first node and said fourth capacitor means being connected to said second capacitor means and said connection forming a second node:
   (d) first buffer means having an input and an output, and the output of said first buffer means being connected to said second node and the input of said first buffer means being connected to the non-inverting input of the differential gain stage;
   (e) second buffer means having an input connected and an output, and the output of said second buffer means being connected to said first node and the input of said second buffer means being connected to the inverting input of the differential gain stage.

3. The device as claimed in claim 2 further including resistor means having first and second leads, said first lead being coupled to the control terminal of the first transistor and said second lead being coupled to the control terminal of the second transistor.

4. The device as claimed in claim 3 further including first and second emitter current sources, said first emitter current source being coupled to the control terminal of the first transistor and having means for producing a bias current for biasing the first transistor, and said second emitter current source being coupled to the control terminal of the second transistor and having means for producing a bias current for biasing the second transistor.

5. The device as claimed in claim 4 further including a first load resistor coupled between the output terminal of the first transistor and a positive supply rail and a second load resistor coupled between the output terminal of the second transistor and said positive supply rail.

6. The device as claimed in claim 1 further including resistor means having first and second leads, said first lead being coupled to the control terminal of the first transistor and said second lead being coupled to the control terminal of the second transistor.

7. The device as claimed in claim 6 further including first and second emitter current sources, said first emitter current source being coupled to the control terminal of the first transistor and having means for producing a bias current for biasing the first transistor, and said second emitter current source being coupled to the control terminal of the second transistor and having means for producing a bias current for biasing the second transistor.

8. The device as claimed in claim 7 further including a first load resistor coupled between the output terminal of the first transistor and a positive supply rail and a second load resistor coupled between the output terminal of the second transistor and said positive supply rail.

* * * * *